United States Patent [19]

Murata

[11] 4,083,755
[45] Apr. 11, 1978

[54] METHOD AND APPARATUS FOR SELECTIVELY PLATING RECTANGULAR SHEET CONTINUOUSLY OR INTERMITTENTLY

[75] Inventor: Yasuyuki Murata, Kamakura, Japan

[73] Assignee: Electroplating Engineers of Japan, Limited, Tokyo, Japan

[21] Appl. No.: 675,135

[22] Filed: Apr. 8, 1976

[30] Foreign Application Priority Data

Jun. 14, 1975  Japan ................................ 50-80126

[51] Int. Cl.² .............................................. C25D 5/02
[52] U.S. Cl. .................. 204/15; 204/224 R; 427/282; 427/304; 427/305; 427/306; 427/424
[58] Field of Search ................. 427/282, 304–306, 427/424; 204/15; 118/301

[56] References Cited

U.S. PATENT DOCUMENTS

| | | | |
|---|---|---|---|
| 1,546,834 | 7/1925 | Hanington | 427/282 |
| 3,434,865 | 3/1969 | Doquire et al. | 427/282 |
| 3,632,382 | 1/1972 | Reed et al. | 427/282 |
| 3,672,939 | 6/1972 | Miller | 427/304 |
| 3,819,497 | 6/1974 | Grunwald et al. | 427/282 |
| 3,850,656 | 11/1974 | Brown | 427/282 |
| 3,860,499 | 1/1975 | Graham et al. | 204/15 |
| 3,897,323 | 7/1975 | Schlotthauer | 204/15 |
| 3,967,009 | 6/1976 | Blake | 427/282 |

*Primary Examiner*—Ronald H. Smith
*Assistant Examiner*—Janyce A. Bell
*Attorney, Agent, or Firm*—Blanchard, Flynn, Thiel, Boutell & Tanis

[57] ABSTRACT

While a rectangular sheet is being passed between a masking packing having at least one opening of a configuration corresponding to the selected area of the sheet to be plated and a pressure packing, a jet of plating solution is continuously directed from a nozzle against the masking packing opening or a jet of plating solution is intermittently directed from a specially designed nozzle against the opening in response to the intermittent movement of the rectangular sheet, thereby selectively plating the rectangular sheet in the lengthwise direction continuously or intermittently.

11 Claims, 11 Drawing Figures

METHOD AND APPARATUS FOR SELECTIVELY PLATING RECTANGULAR SHEET CONTINUOUSLY OR INTERMITTENTLY

The present invention relates to a method and an apparatus for selectively plating continuously or intermittently a rectangular sheet in coil, plate or other form in the lengthwise direction.

With the plating methods and apparatus heretofore known for plating rectangular sheets in coil, plate or other form, it has been the general practice to plate the whole surface of the sheet by immersing the entire sheet in a plating bath by a plating bath immersion process and bath immersion apparatus. However, this overall plating has various disadvantages, such as, the areas other than those requiring the plating are also plated necessitating additional labor for removing the undesired coatings after completion of the plating and so on, and this not only results in increased costs but also necessitates the use of a larger equipment for plating rectangular sheets with the resulting want of economy.

Thus, there has existed a need for an improved method and apparatus therefor capable of accomplishing the selective plating of rectangular sheets of the above type continuously or intermittently with a simple arrangement and with increased reliability and smoothness as well.

In other words, the present invention provides an improved method and apparatus wherein while continuously or intermittently moving a rectangular sheet to be plated which is in strip or other form, the desired selective plating of the rectangular sheet is accomplished, continuously or intermittently, employing rollers and specially designed packings, thereby ensuring that the desired selective plating of rectangular sheets of this type is automatically accomplished, continuously or intermittently, in a simple manner with improved efficiency and reliability and without the need for special techniques.

It is therefore an object of this invention to provide a method and apparatus for selectively plating a rectangular sheet to be plated, continuously or intermittently, wherein the rectangular sheet is fed by a pair of sheet guiding inlet guide rollers and a pair of outlet pull rollers into the plating apparatus which is provided with a pair of packings pressed against each other with a predetermined pressure so as to permit the rectangular sheet held between the pair of packings to pass therethrough continuously or intermittently, whereby the rectangular sheet is selectively plated continuously or intermittently in response to the continuous or intermittent movement of the rectangular sheet.

It is another object of this invention to provide such method and apparatus wherein the pair of packings consist of a masking packing of specially devised configuration and construction and a pressure packing for pressing the moving rectangular sheet against the masking package, whereby the desired selective plating of the rectangular sheet in the lengthwise direction thereof is accomplished continuously or intermittently with improved efficiency and reliability while the rectangular sheet is being passed between the packings continuously or intermittently.

It is still another object of this invention to provide such method and apparatus further incorporating a device for switching the direction of flow of the plating solution supplied to a plating solution spray nozzle, whereby the spraying and non-spraying of the plating solution are controlled without the flow of the plating solution being stopped in case of need, thus ensuring that the desired selective plating, particularly the intermittent selective plating of a rectangular sheet, is accomplished with improved stability and reliability by means of an apparatus which is simple and compact in construction.

The above and other objects, features and advantages of this invention will become readily apparent from the following detailed description taken in conjunction with the accompanying drawings, in which.

Figure 1:
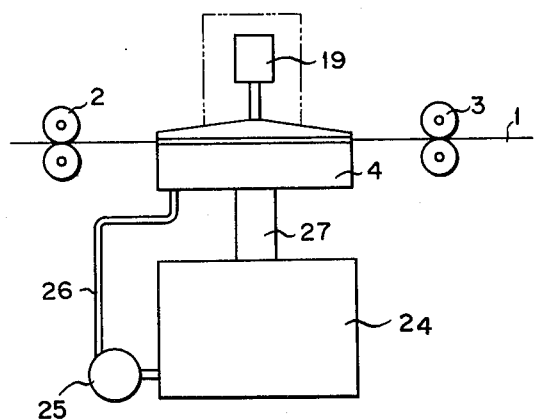
FIG. 1 is a schematic front view of a plating apparatus for selectively plating a rectangular sheet continuously or intermittently.
Figure 2:
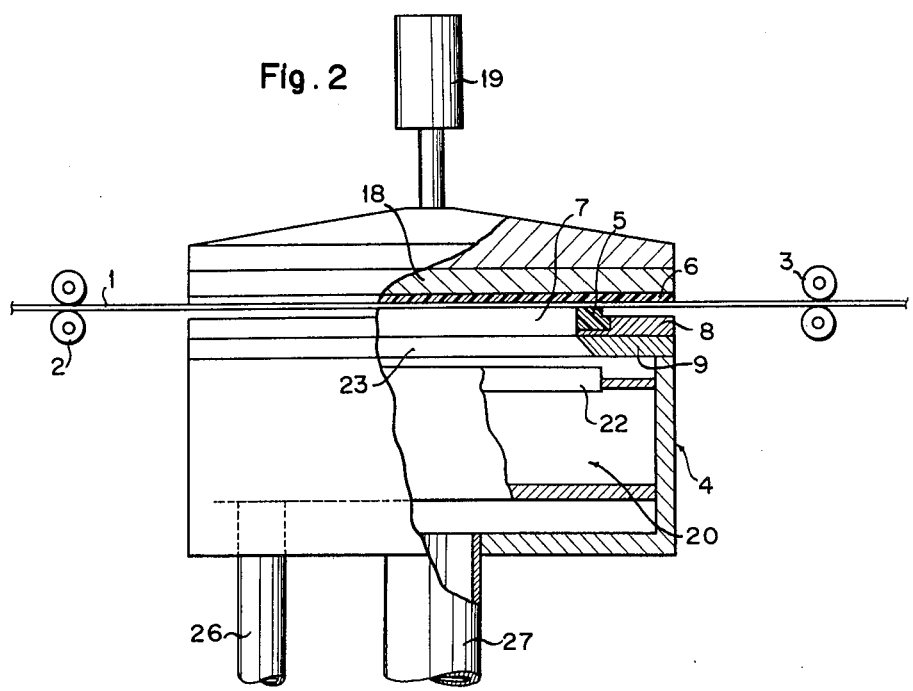
FIG. 2 is a partial enlarged view of the plating apparatus of FIG. 1 with a part thereof broken away to show in part the pair of packings and the plating box.
Figure 3:
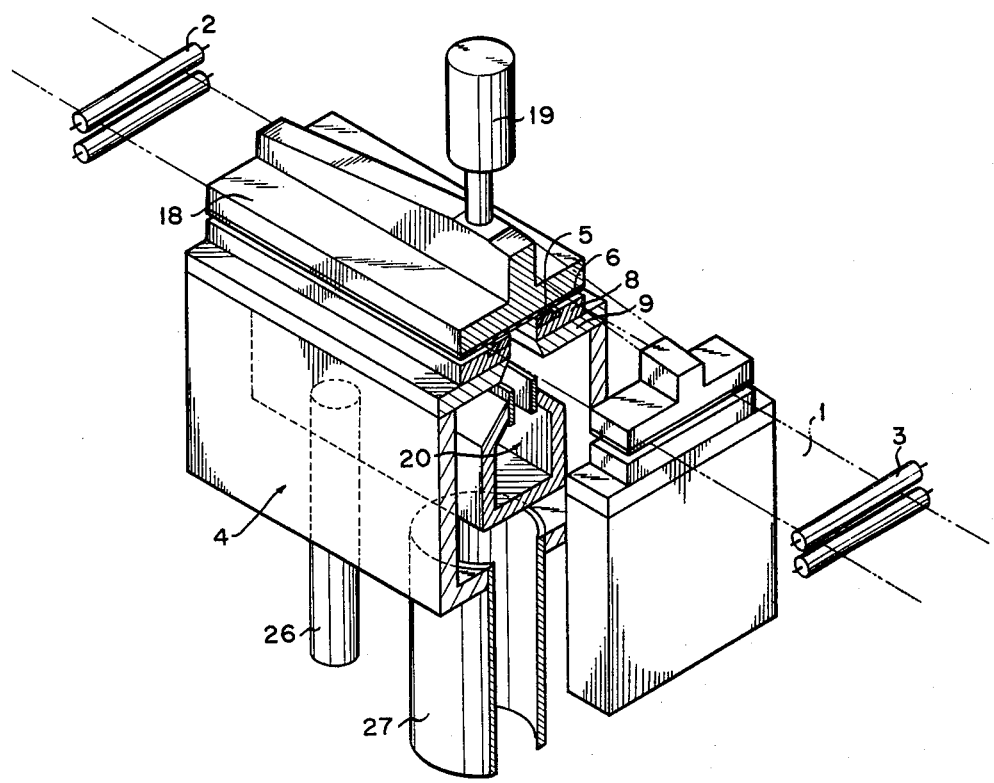
FIG. 3 is a partial and enlarged perspective view of the plating apparatus of FIG. 1 with a part thereof broken away to show its peripheral parts including the packings and the plating box.

The present invention will now be described in greater detail with reference to the accompanying drawings. An embodiment of the apparatus of this invention will be described first with reference to the related drawings and the method of this invention will be described later in detail in connection with the description of the operation of this embodiment. In the drawings, the identical or similar parts are designated by the identical reference numerals.

Figure 4:
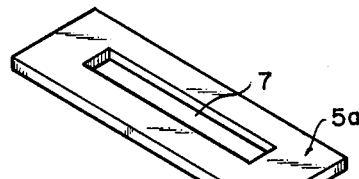
FIGS. 4, 5 and 6 are perspective views showing different modified forms of the masking packing.
Figure 5:
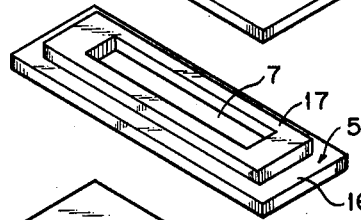
Figure 6:
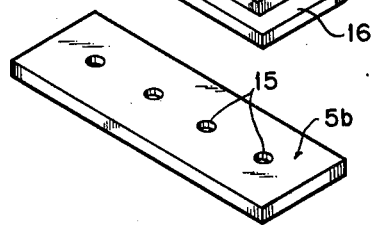
Figure 7:
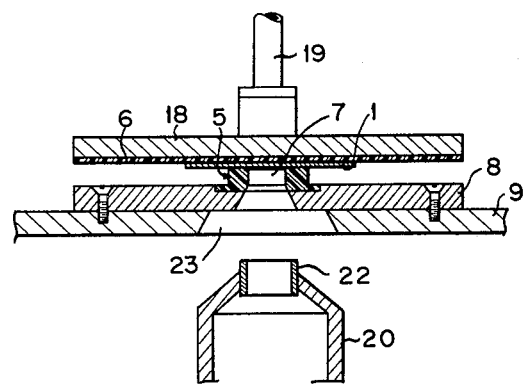
FIG. 7 is a partial sectional view showing the relative positions of the masking packing shown in FIG. 5 and the associated pressure packing.
Figure 8:
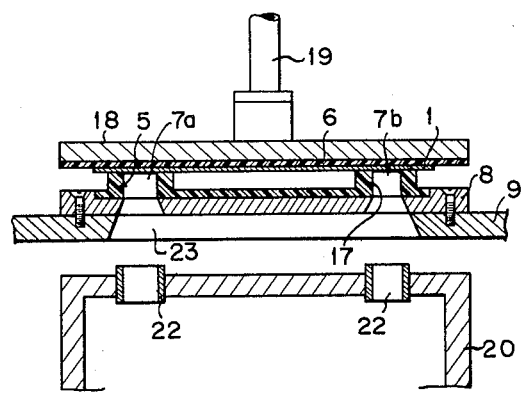
FIG. 8 is a partial sectional view showing the relative positions of a masking packing having two openings and the associted pressure packing.

The method and apparatus according to this invention are particularly useful for plating a rectangular sheet 1 which may be a coil, plate or the like, and this rectangular sheet 1 is continuously or intermittently moved in the horizontal direction between a pair of inlet guide rollers 2 and a pair of outlet pull rollers 3. The pull rollers 3 are adapted to serve both as electrode contacts and as guide rollers. Arranged between the pairs of rollers 2 and 3 are a pair of packings and a plating box 4. The pair of packings include a masking packing 5 located in the lower position in the illustration and a pressure packing 6 located in the upper position in the illustration. The masking packing 5 which is formed with an opening 7 of the desired configuration is fixedly mounted on a supporting plate 8, and the supporting plate 8 is replaceably held in position on an upper cover 9 of the plating box 4. The opening 7 in the masking package 5 has a configuration corresponding to that area of the rectangular sheet 1 which is to be plated and therefore masking packings having different openings are selectively used. For instance, when it is desired to apply a localized plating 11 of a predetermined width on a coil 10 (FIG. 10) in the lengthwise direction thereof, a masking packing 5a or 5 with a slit like opening 7 is used, whereas when it is desired to plate only spots 14 on an IC lead frame 13 (FIG. 11), a masking packing 5b with circular openings 15 is used (FIGS. 4 through 6). Further, a plurality of the openings 7 may be provided as shown in FIG. 8 in which the masking packing 5 is provided with a pair of openings 7a and 7b which are provided parallel to each other in the direction of movement of the rectangular sheet 1.

The previously mentioned pressure packing 6 is used to press the rectangular sheet 1 which is being moved continuously or intermittently between the guide rollers 2 and the pull rollers 3 against the masking packing 5 (5a or 5b) while permitting the movement of the rectangular sheet 1, and therefore the rectangular sheet 1 is moved while rubbing against the packings. Thus, it is preferable to select as the material for the packings a low friction coefficient material such as Teflon (trademark) and to reduce the contact area. In other words, the masking packing 5 shown in FIG. 5 is provided with a flange 17 which is formed along the edge of the opening 7 on its surface 16 related with the pressure packing 6, and thus the rectangular sheet 1 is moved while contacting with the packings only between the flange 17 and the pressure packing 6. The pressure packing 6 is attached to a pressure plate 18 so that a predetermined pressure is applied to the pressure packing 6 by a pressure cylinder 19. The pressure cylinder 19 may be replaced with a spring (not shown) which applies a adjusted pressure.

The plating box 4 includes a built-in nozzle 20 for directing plating solution against the opening 7 (15) of the masking packing 5 (5a, 5b). The nozzle 20 is provided at its spraying orifice with anode metal plates 22 and it sprays the plating solution at all times or intermittently. The nozzle 20 may be provided with a plurality of spraying orifices (FIG. 8) or alternately a plurality of nozzles may be provided. The upper cover 9 of the plating box 4 is provided with an opening or openings 23 of a size corresponding to or greater than that of the masking packing opening 7 and the openings 7 and 23 are communicated with each other.

The plating box 4 is further provided with means for circulating and supplying the plating solution. As shown in the drawings, this means includes a plating solution tank 24, a pump 25, a plating solution supply pipe 26 and a plating solution return pipe 27.

The nozzle 20 should preferably be adapted to spray the plating solution either continuously or intermittently as desired and to attain this objective a wall attachment amplifier 28 (FIG. 9) may be incorporated in the nozzle 20 so that the plating solution is sprayed intermittently or it is sprayed only on demand.

In the past, while various methods of changing the direction of flow of fluid have been proposed in which the switching of fluid is accomplished directly by means of a valve or the like or the switching is effected by stopping and restarting a power source for fluid such as a pump, these conventional methods are disadvantageous in that stopping the flow of fluid directly by means of a valve or the like produces a back pressure which in turn causes damage to the pipes, etc., whereas frequent stopping and restarting of a pump tends to cause irregularities in the pump, and there are other disadvantages such as reduced operating efficiency, etc.

It has also been the practice to mount the fluid switching device such as a valve separately from the nozzle and the plating box with the resulting disadvantage that this arrangement results in an increased space for installation as well as an increase in the number of places where there exist danger of leakage of fluid.

In view of these deficiencies, in accordance with the present invention a fluid switching device is incorporated in the nozzle of the plating box, thereby realizing an integral construction which is simpler and more compact, eliminating the danger of leakage and ensuring positive switching of fluid without the need to stop the flow of fluid thus preventing the occurrence of back pressure of the fluid.

Figure 9:
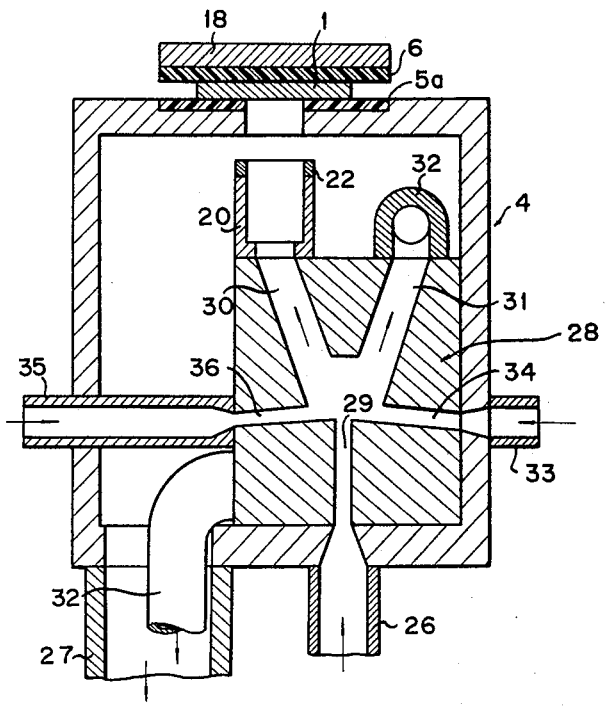
FIG. 9 is a longitudinal sectional view of the nozzle and the plating box used in the apparatus of FIG. 1, showing the principal parts of the wall attachment amplifier incorporated in the nozzle.

Referring now to FIG. 9, the wall attachment amplifier 28 is integrally assembled to the nozzle 20 of the plating box 4 and constructed so that a stream of plating solution (hereinafter referred to as a main stream) which is supplied under a pressure higher than a predetermined value is introduced from the fluid supply pipe 26 and delivered through a main passage 29 to either of two directions, namely, to the spray nozzle 20 through a spraying passage 30 branched off the main passage 29 or to a fluid outlet pipe 32 through a return passage 31 also branched off the main passage 29. To spray the main stream through the spray nozzle 20, a control stream is introduced from a control stream supply pipe 33 so that the control stream flows through a control passage 34 and impinges against the main stream delivered from the main passage 29 of the fluid supply pipe 26, deflecting the main stream toward and spraying through the spray nozzle 20. The main stream sprayed through the spray nozzle 20 strikes against an object 1 to be plated, plates the object 1 and then returned to the plating solution tank for further circulation. On the other hand, when it is desired to switch the direction of flow of the main stream from the spray nozzle 20 to the fluid outlet pipe 32, the control stream is introduced through a control stream supply pipe 35 so that the control stream flows through a control passage 36, impinges against the main stream delivered from the main passage 29 of the fluid supply pipe 26 and deflects the main stream toward the fluid outlet pipe 32, thus delivering the main stream back into the plating solution tank through the return passage 31 and the fluid outlet pipe 32 for repeated circulation. Experiments conducted showed that when the control stream was controlled by means of a valve or the like and the control stream supply pipe was closed while the main stream was being delivered toward the spray nozzle 20, a pressure equivalent to atmospheric pressure was applied to the main stream through the control stream supply pipe 35 and the main stream was accurately switched to flow in the direction of the fluid outlet pipe 32.

The apparatus of this invention operates as follows. Although not shown in the drawings, it is arranged so that at the same time that the spraying of plating solution is started, a rectifier is connected to a power source and a DC current is supplied from the output of the rectifier. The positive terminal of this DC power source is connected through a lead wire to the anode / solution spray nozzle 20 and the negative terminal of the DC power source is connected to the cathode contact / pull rollers 3 through a lead wire. Consequently, the rectangular sheet 1 to be plated is directly contacted with the cathode contact/pull rollers 3 so that the DC current flows to the rectangular sheet 1 and the rectangular sheet 1 is electroplated at the portion corresponding to the opening 7 in the masking packing 5.

In this case, the selective plating of the rectangular sheet 1 is successively automatically accomplished continuously while the rectangular sheet 1 is being pressed by the pressure cylinder 19 and continuously moved by the guide rollers 2 and the pull rollers 3.

Figure 10:
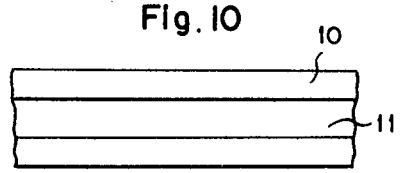
FIG. 10 is a partial plane view of a rectangular sheet in which only the selected area of a predetermined width was continuously plated in the lengthwise direction.
Figure 11:
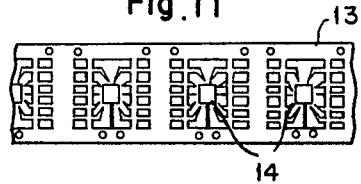
FIG. 11 is a partial plan view of a rectangul sheet or an IC lead fram in which only the desired parts were intermittently plated.

Further, by properly adjusting, simultaneously with the above-mentioned operation, the pulling rate and force of the cathode contact / pull rollers 3 for the rectangular sheet 1 which is pressed by the pressure cylinder 19 to accomplish the continuous operation, it is possible to apply on the rectangular sheet 1 a continuous selective plating having a predetermined thickness as well as a predetermined plating pattern such as the plated area 11 shown in FIG. 10. On the other hand, by intermittently moving the rectangular sheet and correspondingly interrupting the spraying of plating solution, it is possible to intermittently plate the rectangular sheet as shown in FIG. 11.

Where the wall attachment amplifier 28 is incorporated in the nozzle 20, with the plating solution (hereinafter referred to as a main stream) supplied under a pressure higher than a predetermined value through the fluid supply pipe and delivered from the amplifier 28 through its passages, the direction of flow of this main stream may be easily and positively switched by introducing a control stream through the control stream supply pipe and impinging it against the main stream and this arrangement is best suited for use in applications where the plating solution must be sprayed intermittently or only on demand. In other words, when the control stream is introduced through one of the control stream supply pipes, the main stream is deflected to flow toward the spray nozzle, sprayed from the spray nozzle, impinged against the object to be processed and returned, after the processing, to the plating solution tank through the fluid outlet pipe for further circulation. On the other hand, when the control stream is introduced through the other control stream supply pipe, the main stream is deflected to flow toward the fluid outlet pipe, delivered through the fluid outlet pipe and returned to the plating solution tank for further circulation.

It will thus be seen that by incorporating a Coanda effect wall attachment amplifier in the nozzle, it is possible to accurately switch the direction of flow of the main stream by impinging the main stream and the control stream against each other but without stopping the flow of the main stream itself.

(EXAMPLE)

By using a coil made of phosphor bronze hoop material and having a coil weight of 50 Kg, plate thickness of 0.3 mm, plate width of 30 mm, coil inner diameter of 380 $\phi$mm and coil outer diameter of 900 $\phi$mm and the illustrated apparatus and by moving the coil at a take-up speed of 8 m/min between the guide rollers and the pull rollers, gold plating solution was sprayed from the nozzle and a continuous plating of 10 mm wide was applied on the coil, thus accomplishing the continuous selective plating of the long, narrow area of the coil at high speed of 15 sec/1 $\mu$ with extremely high efficiency.

By virtue of the fact that the selective plating of a rectangular sheet is accomplished while the sheet is being automatically moved continuously, the present invention has many great practical advantages. The principal advantages of this invention over the prior art are summarized as follows.

(A) The desired continuous or intermittent selective plating can be accomplished efficiently, accurately and smoothly.

(B) The manufacturing costs can be reduced through labor-saving method and apparatus.

(C) The apparatus is simple in construction and is almost trouble-free.

(D) The equipment costs can be reduced.

(E) The incorporation of a Coanda effect wall attachment amplifier in the nozzle has the effect of ensuring positive and accurate switching of the direction of flow of liquid, making the spraying of liquid more stable, contributing in improving the operating efficiency, and making the apparatus itself more compact integrally assembled with the resulting simplified constructure. Also, the practical utility of the invention is very great since it has many features and advantages, such as, the avoidance of occurrence of back pressure during the switching of liquid flow due to the absence of stoppage of liquid flow in contrast to the conventional methods and apparatus employing a valve.

What is claimed is:

1. A process for continuously electroplating a selected area of an elongated electroconductive sheet, comprising the steps of:

continuously pressing a plate-form pressure packing member against a plate-form masking packing member;

continuously forcibly moving said sheet in the longitudinal direction thereof between said packing members so that said masking packing member contacts a surface portion of one side of said sheet and said pressure packing member contacts a surface portion of the opposite side of said sheet, said pressure packing member being pressed against said sheet and thereby presses said sheet against said masking packing member, said masking packing member having opening means therethrough having a configuration corresponding to the selected area to be plated of said sheet with the perimeter of said opening means being in substantially sealed contact with said one side of said sheet, and simultaneously connecting said sheet to the negative side of a source of DC electroplating potential;

continuously pumping electroplating solution from storage tank means through nozzle means associated with said opening means and thereby spraying jet means of said electroplating solution into said opening means in said masking packing member during the movement of said sheet while simultaneously connecting said nozzle means to the positive side of said source of DC electroplating potential whereby said electroplating solution continuously contacts said selected area of said sheet and an electroplated coating is continuously deposited on said selected area of said sheet as it is moved between said masking packing member and said pressure packing member, and continuously returning said electroplating solution from said opening means to said storage tank means.

2. A process according to claim 1 in which said electroplating solution is flowed in contact with anode means located at the tip end of said nozzle means, said anode means being opposed to and located close to said opening means.

3. A process according to claim 2 in which said pressure packing member is pressed against said sheet by fluid pressure.

4. A process according to claim 2 in which said pressure packing member is pressed against said sheet by spring pressure.

5. A process according to claim 2 in which sheet and said pressure packing member are planar and imperforate and said pressure packing member sealingly contacts said opposite surface of said sheet to prevent electroplating of said opposite surface.

6. A process for intermittently electroplating selected areas of an elongated electroconductive sheet, comprising the steps of:
  continuously pressing a plate-form pressure packing member against a plate-form masking packing member,
  intermittently forcibly moving said sheet in the longitudinal direction thereof between said packing members so that said masking packing member contacts a surface portion of one side of said sheet and said pressure packing member contacts the opposite side of said sheet, said pressure packing member being pressed against said sheet and thereby presses said sheet against said masking packing member, said masking packing member having opening means therethrough having a configuration corresponding to the selected area to be plated of said sheet with the perimeter of said opening means being in substantially sealed contact with said one side of said sheet, and simultaneously connecting said sheet to the negative side of a source of DC electroplating potential;
  pumping electroplating solution from storage tank means to nozzle means associaed with said opening means and thereby spraying jet means of said electroplating soultion into said opening means in said masking packing member when said sheet is not in motion while simultaneously connecting said nozzle means to the positive side of said source of DC electroplating potential whereby said electroplating solution contacts said selected area of said sheet and an electroplating coating is deposited on said selected area of said sheet, discontinuing spraying of said electroplating solution when said sheet is in motion, and returning said electroplating solution from said opening means to said storage tank means.

7. A process according to claim 6 in which said electroplating solution is flowed in contact with anode means located at the tip end of said nozzle means, said anode means being opposed to and located close to said opening means.

8. A process according to claim 7 in which said pressure packing member is pressed against said sheet by fluid pressure.

9. A process according to claim 7 in which said pressure packing member is pressed against said sheet by spring pressure.

10. A process according to claim 7 in which said sheet and said pressure packing member are planar and imperforate and said pressure packing member sealingly contacts said opposite surface of said sheet to prevent electroplating of said opposite surface.

11. A process according to claim 7 wherein said electroplating solution is continuously pumped from said storage tank means and including the step of intermittently switching the direction of flow of said electroplating solution pumped from said storage tank from flow to said nozzle means to flow to said storage tank means.

* * * * *